(12) United States Patent
Seliuchenko et al.

(10) Patent No.: US 9,151,677 B2
(45) Date of Patent: Oct. 6, 2015

(54) METHOD AND SYSTEM FOR DEMODULATING SIGNALS

(75) Inventors: Volodymyr Seliuchenko, Kyiv (UA); Maarten Kuijk, Antwerp (BE)

(73) Assignee: MELEXIS TECHNOLOGIES NV, Tessenderlo (BE)

( * ) Notice: Subject to any disclaimer, the term of this patent is extended or adjusted under 35 U.S.C. 154(b) by 204 days.

(21) Appl. No.: 13/992,000

(22) PCT Filed: Dec. 6, 2011

(86) PCT No.: PCT/EP2011/071863
§ 371 (c)(1),
(2), (4) Date: Jun. 6, 2013

(87) PCT Pub. No.: WO2012/076500
PCT Pub. Date: Jun. 14, 2012

(65) Prior Publication Data
US 2013/0256546 A1    Oct. 3, 2013

(30) Foreign Application Priority Data

Dec. 6, 2010  (GB) .................................. 1020630.8

(51) Int. Cl.
*G01J 4/04*    (2006.01)
*G01J 9/00*    (2006.01)
(Continued)

(52) U.S. Cl.
CPC ................. *G01J 9/00* (2013.01); *G01S 7/4914* (2013.01); *H01L 31/0224* (2013.01); *H01L 27/14603* (2013.01)

(58) Field of Classification Search
CPC ........................................ G01J 9/00; G01J 4/04
USPC ............................................ 250/370.14, 371
See application file for complete search history.

(56) References Cited

U.S. PATENT DOCUMENTS

| 3,934,161 | A | 1/1976 | Caywood |
| 4,931,648 | A | 6/1990 | Elliott et al. |

(Continued)

FOREIGN PATENT DOCUMENTS

| DE | 19704496 | 3/1998 |
| EP | 1777747 | 4/2007 |

(Continued)

OTHER PUBLICATIONS

International Search Report for PCT/EP2011/071863, completed by the European Patent Office International Searching Authority, dated Mar. 1, 2012.

(Continued)

*Primary Examiner* — David Porta
*Assistant Examiner* — Faye Boosalis
(74) *Attorney, Agent, or Firm* — Workman Nydegger (57) ABSTRACT

A demodulation sensor (30) is described for detecting and demodulating a modulated radiation field impinging on a substrate (31). The sensor comprises the means (1,7,15) for generating, in the substrate, a static majority current assisted drift (Edrift) field, at least one gate structure (33) for collecting and accumulating minority carriers (21), the minority carriers generated in the substrate by the impinging radiation (28) field. The at least one gate structure comprises at least two regions (4,9,18) for the collection and accumulation of the minority carriers (21) and at least one gate (5,6,8) adapted for inducing a lateral electric drift field under the gate structure, the system thus being adapted for directing the minority carriers (21) towards one of the at least two regions (4,9) under influence of the static majority current assisted drift field and the lateral electric drift field induced by the at least one gate, and a means for reading out the accumulated minority carriers in that region.

14 Claims, 6 Drawing Sheets

(51) Int. Cl.
*G01S 7/491* (2006.01)
*H01L 31/0224* (2006.01)
*H01L 27/146* (2006.01)

(56) References Cited

U.S. PATENT DOCUMENTS

| | | |
|---|---|---|
| 5,856,667 A | 1/1999 | Spirig et al. |
| 6,987,268 B2 | 1/2006 | Kuijk et al. |
| 2005/0051730 A1 | 3/2005 | Kuijk et al. |
| 2005/0092897 A1 | 5/2005 | Schwarte |
| 2007/0164767 A1 | 7/2007 | Herz |
| 2008/0247033 A1 | 10/2008 | Buettgen et al. |
| 2009/0224139 A1 | 9/2009 | Buettgen et al. |

FOREIGN PATENT DOCUMENTS

| | | |
|---|---|---|
| EP | 1777811 | 4/2007 |
| GB | 2389960 | 12/2003 |
| WO | 2010013779 | 2/2010 |
| WO | 2010025331 | 3/2010 |

OTHER PUBLICATIONS

Search Report for application No. GB1020630.8, completed, dated Mar. 23, 2011.

METHOD AND SYSTEM FOR DEMODULATING SIGNALS

FIELD OF THE INVENTION

The present invention relates to the field of detection of electromagnetic radiation impinging on semiconductor material. More particularly, the present invention relates to a demodulation sensor and a method for the detection and demodulation of temporally modulated electromagnetic radiation fields for the use in time of flight applications, where the phase shift of a modulated radiation field is determined to estimate the distance to a target.

BACKGROUND OF THE INVENTION

The behavior of many systems in technology is investigated by means of demodulation techniques, whereby the system is excited with a modulated signal and the properties of the reflected radiation are used to determine the characteristics of the system under investigation.

A particular example of measuring techniques which require the demodulation of a temporally modulated electromagnetic radiation field are the time of flight (TOF) distance measurements, based on the fact that the speed of light is finite and constant in a given medium. In a time of flight experiment, the scene is illuminated by a high frequency modulated light source which is usually located near the detector. The signal reflected from the object travels back to the detector with a delay proportional to the distance. After the demodulation of the received signal, the phase difference between the received and sent signal is obtained, and the distance to the object can be calculated. The distance of the object can be expressed as $$D = c \cdot TOF/2$$

Several sensor architectures with demodulation capabilities were proposed so far. A CCD based device capable of demodulation of the impinging light signal was described in Spirig, "Apparatus and method for detection and demodulation of an intensity-modulated radiation field", U.S. Pat. No. 5,856,667. Another example of the similar approach is described in Seitz, "Four-tap demodulation pixel" GB 2389960. The light impinging on the device creates hole-electron pairs in the bulk of the semiconductor, those that diffused to the top of the sensor are forwarded to the destination potential storage well by means of the lateral electric field under the gates. The drawbacks of this approach are the slow diffusion of the photo-generated charge carriers to the top of the sensor, the presence of the gates over the sensitive area which reduce the responsivity of the sensor and the large gate capacitance that should be driven on each toggling of the control voltage. The same slow diffusion process to the top of the sensor is present in the demodulation device described in Buettgen, "device and method for the demodulation of modulated electric signals", US20080247033, where the photo-generated charge carriers are forced to drift to a particular detection region by providing an alternating potential to different gate contacts of a demodulation gate structure.

Another approach of the implementation of the demodulating sensor is disclosed in Kuijk, "Detector for electromagnetic radiation assisted by majority current", U.S. Pat. No. 6,987,268. The electric field induced in the substrate lifts up the deeply generated carriers and accelerates them in the direction of the detection nodes. The drawback of this approach is the alternating current which has to be supplied to maintain an alternating electric field in the substrate.

SUMMARY OF THE INVENTION

It is an object of the present invention to provide an efficient demodulation sensor and methods for detecting modulated signals with good sensitivity. It is an advantage of embodiments of the present invention to provide demodulation sensors and methods for detecting modulated signals which allows for a fast demodulation of a modulated radiation field by utilizing a static drift field within the sensitive region to accelerate the generated carriers in the substrate towards the demodulation region. It is an advantage of embodiments according to the present invention that a MOS-compatible technology can be used for manufacturing the sensor. It is an advantage of embodiments according to the present invention that a CMOS compatible sensor can be provided.

The above objective is accomplished by a method and device according to the present invention. The present invention relates to a demodulation sensor for detecting and demodulating a modulated radiation field impinging on a substrate, the sensor comprising means for generating, in the substrate, a static majority current assisted drift field, at least one gate structure for collecting and accumulating minority carriers, the minority carriers generated in the substrate by the impinging radiation field, the at least one gate structure comprising at least two regions for the collection and accumulation of the minority carriers and at least one gate for inducing a lateral electric drift field under the gate structure, the system thus being adapted for directing the minority carriers towards one of the at least two regions for the collection and accumulation of the minority carriers under influence of the static majority current assisted drift field and the lateral electric drift field induced by the gate structure, and means for reading out the accumulated minority carriers in that region. The means for reading out may be adapted for calculating the modulation parameters of the incident modulated radiation field. It is an advantage of embodiments according to the present invention that a static drift field can be used for increasing the efficiency of the sensor. The at least two regions for collecting and accumulation may be one detection region and one region acting as dump for the photoelectrons. In one embodiment the at least two regions are at least two detection regions, etc. In one embodiment, the at least one gate structure may comprise at least two gates.

The at least one gate structure may be positioned outside the region whereon the radiation field is impinging.

The at least one gate structure may be adapted for providing a lateral drift field resulting in the charge moving in the lateral drift electric field underneath the gates.

The at least one gate structure or each of the at least one gate structures may comprise a gate positioned near an ohmic contact with a highest potential.

It is an advantage of embodiments according to the present invention that a fast operating system is obtained. The at least one gate structure may operate at a speed of several hundreds of megahertz bandwidth.

The means for generating a static majority current assisted drift field may comprise at least two ohmic contacts in the substrate to generate a majority current assisted drift field. It is an advantage of embodiments according to the present invention that the means for generating a static drift field can be integrated in the sensor.

The means for generating a static majority current assisted drift field and the at least one gate structure may be based on CMOS compatible components.

The means for generating a static majority current assisted drift field may be positioned in a region outside a radiation receiving window of the sensor. It is an advantage of embodiments according to the present invention that the before mentioned components can be easily integrated in the sensor using technology already applied for manufacturing the sensor.

The means for generating a static majority current assisted drift field may be positioned in a region outside a radiation receiving window of the sensor. The sensitive region of the substrate may be such that it does not contain any features on top of the semiconductor substrate thus the substrate may be covered by an anti reflecting coating. It is an advantage of embodiments according to the present invention that the efficiency for detection of radiation in the demodulation sensor can be further enhanced.

The magnitude of the majority current assisted drift field may be adapted to obtain an optimal drift speed of the minority carriers in the substrate.

The generated minority carriers may be collected in the at least two regions of the gate structure in synchrony with the modulation frequency of the modulated radiation source. The gate structures may be arranged in an array on the substrate. The gate structures may be arranged on the sides of the substrate. In some configurations, the gate structures may be arranged on a square substrate. The sensor may comprise means for storing the minority carriers during read-out of the charge values stored in the gate structures. The carriers also can be accumulated in the read-out circuitry.

The lateral electric drift field under the gate structure may be generated by applying a control voltage to at least one gate electrode. The gate electrode may be placed in between the at least two regions. The number of gate electrodes may be optimized to provide a good trade-off between the complexity of the demodulation sensor and achieved maximum demodulation contrast. At least part of the gate structures may be covered with a radiation shielding. It is an advantage of embodiments according to the present invention that generation of electron-holes in the detection regions, which lower the demodulation contrast, can be prevented.

The demodulation sensor may comprise four gate structures for collecting and accumulating minority carriers in corresponding detection regions, the four gate structures being positioned in a cross-shaped configuration.

The sensor may comprise a controller programmed for controlling the means for generating, in the substrate, a static majority current assisted drift field so as to alternate the static majority current assisted drift field for inducing a shutter mode.

The shutter mode can allow the sensor to be used as a conventional (non-demodulating) image sensor.

The present invention also relates to a method for determining the modulation parameters of an incident modulated radiation field impinging on a substrate, the method comprising generating a static majority current assisted drift field in the substrate, collecting and accumulating minority carriers in one of at least two regions using a lateral electric drift field under at least one gate structure and induced by at least one gate of the at least one gate structure, the minority carriers being generated in the substrate by the impinging radiation field, the minority carriers being directed towards one of the at least two regions for collecting and accumulating minority carriers under influence of the static majority current assisted drift field and the lateral electric drift field induced by the at least one gate, reading out the accumulated minority carriers in the regions, and using the read-out of the at least one region for calculating the modulation parameters of the incident modulated radiation field.

Particular and preferred aspects of the invention are set out in the accompanying independent and dependent claims. Features from the dependent claims may be combined with features of the independent claims and with features of other dependent claims as appropriate and not merely as explicitly set out in the claims.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

The drawings are only schematic and are non-limiting. In the drawings, the size of some of the elements may be exaggerated and not drawn on scale for illustrative purposes.

Any reference signs in the claims shall not be construed as limiting the scope. In the different drawings, the same reference signs refer to the same or analogous elements.

DETAILED DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

The findings of the present invention result in the possibility of obtaining a CMOS compatible Time-of-flight (TOF) properties. Nevertheless, the findings of the present invention are not limited to this particular transistor technology and other transistor technologies, such as for example BICMOS or bipolar transistor technology also can be applied.

The findings in embodiments of the present invention are explained with reference to a p-doped substrate as an example, but the present demodulation sensor can be implemented with an n-doped substrate as well. In this case, all the referred here doping types should be inverted (p and n regions become n and p regions respectively). Furthermore, the term "substrate" as used herein refers to any suitable substrate layer which can be used to implement the present invention. For example, a demodulating device according to embodiments of the present invention may comprise a p-doped silicon semiconductor substrate. Also substrates with an epitaxial layer grown on top of it, having a different doping type or a different doping concentration than the substrate layer, can be applied. Other than silicon semiconductor material may also be used to implement the present invention without departing from the scope and spirit of this invention.

Where in the present invention reference is made to typical transistor terminology, reference is implicitly also made to terminology applicable for a three-terminal device, comprising a first main electrode, such as e.g. a drain in the case of a transistor, a second main electrode, such as e.g. a source, and a control electrode such as e.g. a gate, for controlling the flow of electrical charges between the first main electrode and the second main electrode.

In a first aspect, the present invention relates to a demodulation sensor for detecting and demodulating a modulated radiation field impinging on a substrate. The demodulation sensor according to embodiments of the present invention may for example be applied in automotive applications, although embodiments of the present invention are not limited thereto but can be applied in various applications where Time of Flight measurements can be applied. The demodulation sensor is especially suitable for use in a time of flight (TOF) sensor. The sensor according to embodiments of the present invention comprises a means for generating, in the substrate, a static majority current assisted drift field. The means for generating the static majority current assisted drift field may comprise doped regions serving as ohmic contacts to the substrate. The demodulation sensor also comprises at least one gate structure for collecting and accumulating minority carriers, the minority carriers generated in the substrate by the impinging radiation field. The at least one gate structure comprises at least two regions for the collection and accumulation of the minority carriers. The at least one gate structure is adapted for inducing a lateral electric drift field under the gate structure, the system thus being adapted for directing the minority carriers towards one of at least two regions under influence of the static majority current assisted drift field and the lateral electric drift field induced by the gate structure, and a means for reading out the accumulated minority carriers in that region. The at least two regions for collecting and accumulation can be two detection regions, one detection region and one region acting as dump for the photoelectrons, . . .

The read-out component may be a conventional read-out component. The means for reading out of the region may be used for calculating the modulation parameters of the incident modulated radiation field. The system therefore may comprise a calculator or calculating means. The system furthermore may be adapted for calculating a distance to an object emitting/reflecting an electromagnetic signal that has given rise to the generated minority carriers.

By way of illustration, embodiments of the present invention not being limited thereto, different embodiments will now be further discussed based on a MOS gate structure for performing the demodulation.

Figure 1:
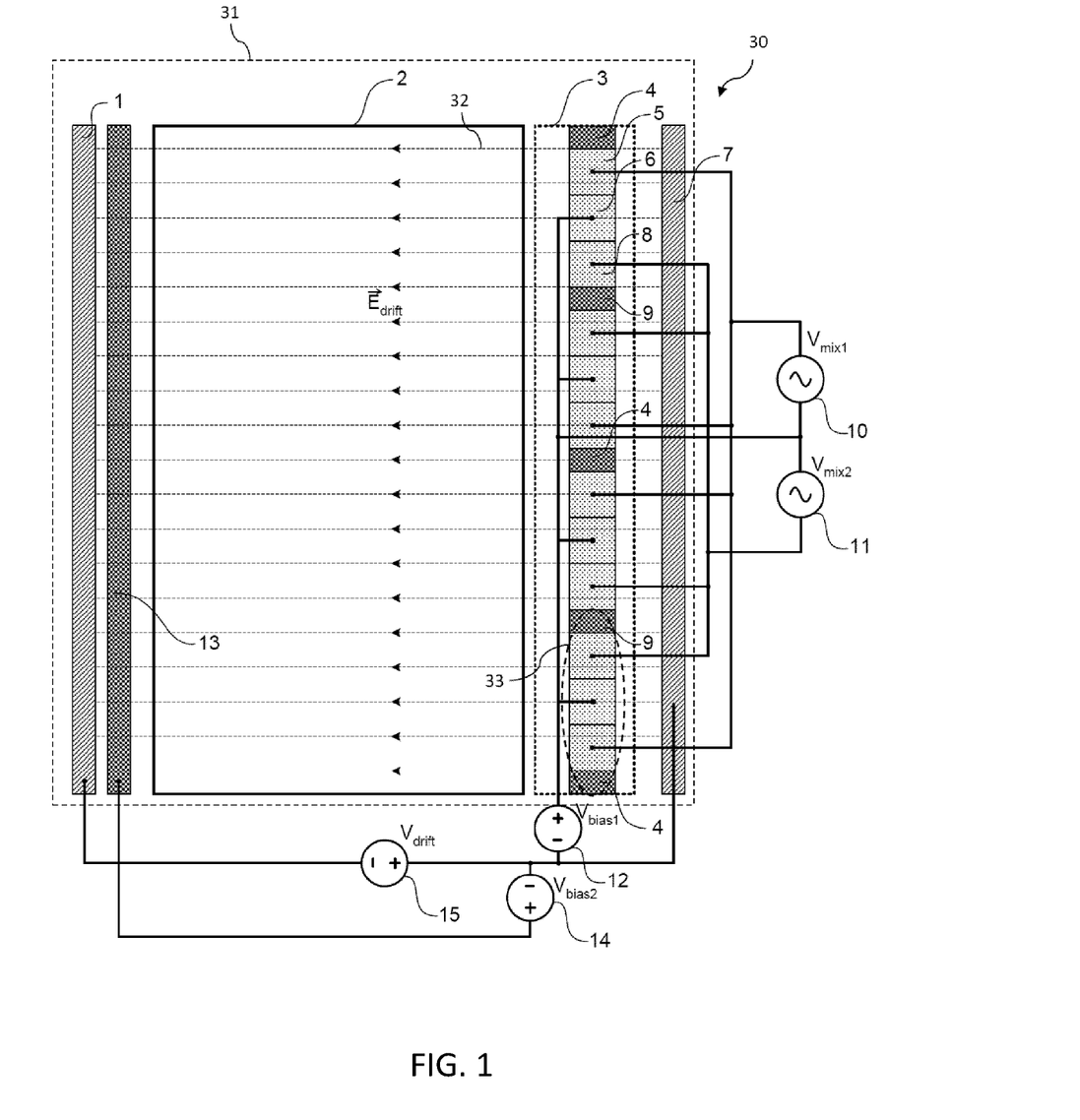
FIG. 1 shows a top view of a modulation sensor according to a first embodiment of the present invention.

FIG. 1 shows a top view of a first embodiment of a demodulation sensor 30 according to an embodiment of the present invention. Two doped p-regions 1 and 7, connected through a voltage source 15, serve as ohmic contacts to the substrate 31, allowing to apply a voltage $V_{drift}$ difference between the doped p-regions 1 and 7. The dopant levels may for example be as those conventionally used in standard CMOS. By way of illustration, embodiments of the present invention not being limited thereto, substrate doping levels may for example be between $1 \cdot 10^{15}$ to $1 \cdot 10^{13}$ cm$^{-3}$, p doping levels may be in the range $1 \cdot 10^{20}$ to $1 \cdot 10^{16}$ cm$^{-3}$, using e.g. a p$^+$ implant ($\sim 10^{20}$ cm$^{-3}$) in a standard CMOS p well ($\sim 1 \cdot 10^{12}$ cm$^{-3}$) to form p doped regions, and n doping levels may be in the range $1 \cdot 10^{20}$ to $1 \cdot 10^{16}$ cm$^{-3}$, using e.g. an n$^+$ implant ($\sim 10^{20}$ cm$^{-3}$) for the MOS source/drain. Different doping levels also may be used. The semiconductor material used may be any suitable semiconductor material, such as e.g. silicon, GaAs, SiGe, etc. Doping levels select may also depend on the semiconductor material used. In operation, if electromagnetic radiation impinges on the p-doped substrate 31, part of the energy transferred to the substrate may be used to create an electron-hole pair in the bulk of the semiconductor. Applying a voltage between the doped p-regions 1 and 7, induces an electric field in the bulk of the semiconductor which provides the drift velocity to photo-n generated charges in the direction defined by the polarity of the voltage source 15. The majority carriers flow from doped p-region 1 to doped p-region 7 when doped p-region has the lowest voltage and from doped p-region 7 to doped p-region 1 when doped p-region 1 has the lowest voltage. The majority charge carriers current can be associated with an electric field distribution $E_{drift}$ in the substrate, indicated in FIG. 1 by straight field lines 32 between the two doped p-regions 1 and 7. The direction of the field lines 32 is the same as the direction of the majority charge carrier current. When the drift field $E_{drift}$ is large enough, it will dominate the slow thermal diffusion processes of the minority carriers in the substrate and generate a net motion of the minority carriers in the opposite direction of the drift field $E_{drift}$.

Figure 2:
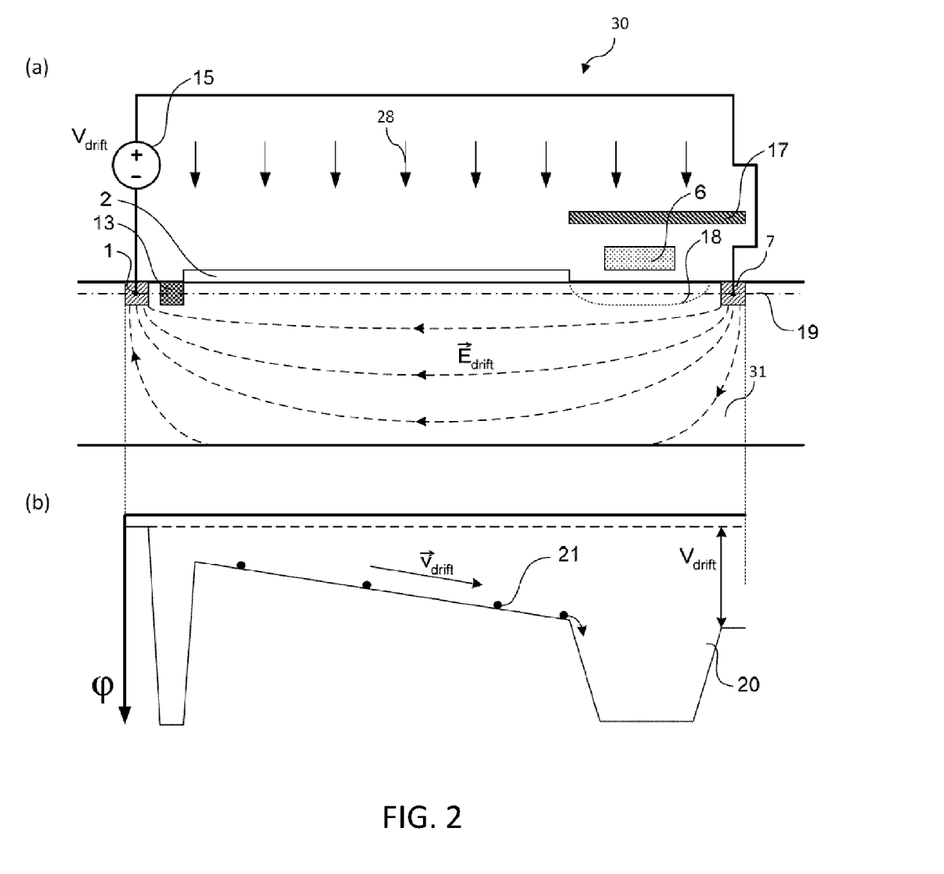
FIG. 2 shows a cross-sectional view of the modulation sensor of FIG. 1, illustrating the electrical field configuration of the sensor in demodulating mode.

When the potential of the doped p-region 7 is higher than the potential of doped p-region 1, the minority carriers will drift towards the doped p-region 7 and encounter the demodulation zone 3. For this particular configuration, the demodulation sensor 30 will be referred further as operating in demodulation mode. When the potential of the doped p-region 7 is lower than the potential of the doped p-region 1, the minority carriers drift towards the doped p-region 1 and the demodulation sensor 30 will be referred further as operating in shutter mode. FIG. 2(a) is a cross-sectional view of a first embodiment of a demodulation sensor 30 according to the present invention illustrating the electric field configuration of the device in demodulation mode. The voltage difference $V_{drift}$ between the doped p-regions 1 and 7 creates a potential distribution $\phi$ in the substrate 31, which is shown in FIG. 2(b) at a depth 19 in the substrate 31. Minority carriers 21, generated in the substrate 31 by the impinging radiation 28, drift rapidly towards the doped p-region 7 and get trapped in the space charge region electric field (depletion region) 18 of the demodulation zone 3. According to the present invention, the demodulation zone 3 comprises at least one gate structure for collecting and accumulating the generated minority carriers 21. In FIG. 1, for example, the demodulation zone 3 consists of an array of gate structures 33, located in between the sensitive region 2 and the doped p-region 7 of the semiconductor substrate. The example comprises several conductor-insulator-semiconductor (MOS) structures with detection regions at their both sides. It is an advantage of the present invention that the demodulation zone 3 covers only a small part of the substrate 31, so that a large sensitive area 2 remains without any responsivity reducing gate structures 33. In a particular embodiment of the present invention, for example in the case of a high reflective silicon substrate, the device responsivity of the demodulation sensor 30 may furthermore be increased by placing an anti reflecting coating AR on top of the sensitive area 2.

To have a fast operating demodulation sensor 30, the speed by which the minority carriers 21 are accelerated towards the detection and demodulation region 3 should be as high as possible. This speed depends on the magnitude of the drift field $E_{drift}$, and thus on the applied voltage $V_{drift}$ of the voltage source 15. In general, the higher the drift field $E_{drift}$, the higher the drift speed $v_{drift}$ of the minority charge carriers 21, until saturation of the minority charge carriers mobility is achieved due to very high voltages. To determine the optimal drift field, models well-known in the field of semiconductor research can be applied.

Enhanced sensitivity of the demodulation sensor 30 may furthermore be achieved by adjusting the size of the sensitive region 2. The larger the sensitive region 2, the more electron-hole pairs can be generated in the substrate 31. Moreover, the larger the sensitive region 2, the larger the distance between the doped p-regions 1 and 7, and the deeper the drift field $E_{drift}$ will penetrate in the substrate 31. This is of particular interest in the case of electromagnetic radiation with a long wavelength (for instance infrared light) impinging on the substrate 31, where the deeply generated minority carriers 21 can benefit from a fast and efficient drift transport towards the modulation zone 3.

Figure 3:
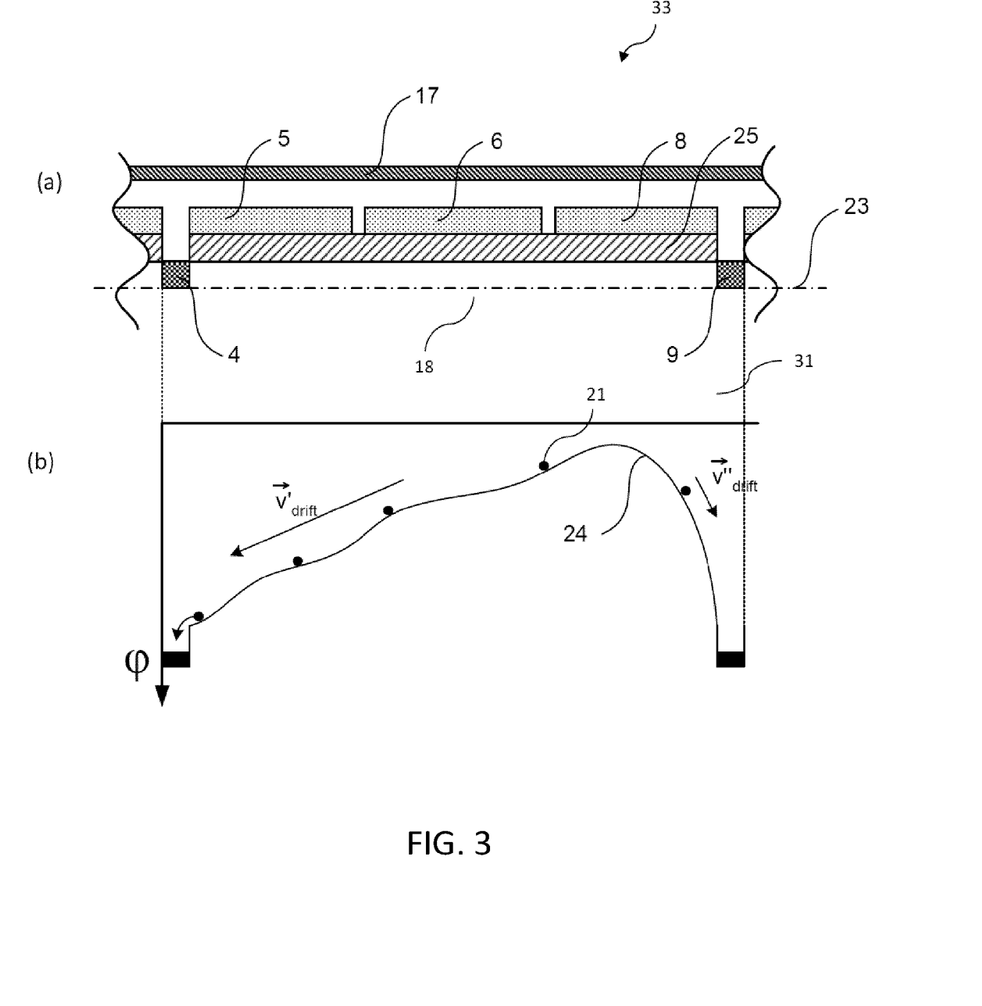
FIG. 3 shows a cross-sectional view of the modulation sensor of FIG. 1, illustrating the gate structure and electric field configuration under it.

FIG. 3(a) is a cross-sectional view of a gate structure 33 according to a preferred embodiment of the present invention. The gate structure 33 comprises a transparent insulating layer 25, preferentially an oxide, which covers the semiconducting substrate 31. On top of the insulator 25, three gate electrode surfaces 5, 6 and 8 are formed, which are each connected to the respective voltage sources 10, 11 and 12. Furthermore, the gate structure 33 comprises two highly doped n+ detection zones 4 and 9 where the minority carries are collected. By applying a voltage difference between the gates 5, 6 and 8, a non-uniform potential distribution $\phi$ at the semiconductor-insulator interface between the detection zones 4 and 9 is induced. FIG. 3(b) shows the electrostatic potential 24 at a depth 23 in the substrate 31 for the case when the potential on gate 5 is higher than the potential of gate 6 which is higher than the potential of gate 8. As it can be seen from FIG. 3(b) the majority of the minority carriers 21 which enter the depletion region 18 under the gate structure 33 will drift away from gate structure 8 towards gate structure 5 with a velocity $v'_{drift}$, and get trapped in the n$^+$-well of the detection region 4. A minority of the photoelectrons however will be forwarded to the wrong detection region 9 with a velocity $v''_{drift}$. Increasing the number of gates will reduce the number of carriers with $v''_{drift}$ velocity at the expense of more complicated routing and sensor driving circuitry. Alternatively or in addition thereto, the number of carriers with $v''_{drift}$ velocity also will be reduced by shielding the respective parts of the sensor with shielding material. For example in a structure according to FIG. 1 this could be performed by providing bands of shielding material all the way across the sensor covering regions 4 and 9, the bands of shielding material preferably being a bit more broad than the regions 4 and 9. The ratio of the number of photoelectrons collected by the region 4 to the total number of photoelectrons which enter the depletion region 18 will define the efficiency of the demodulation which has direct impact on the signal to noise ratio of the detected signal and hence on the measured distance precision by the demodulation sensor. In the inverse case, when the potential on gate 5 is lower than the potential of gate 6 which is lower than the potential of gate 8, the photoelectrons 21 generated by the impinging radiation will be collected in detection region 9. The collected charges on the detection zones 4 and 9 can be read out with known electronic circuits such as for example a charge integration circuit, which generates an output voltage indicative of the total charge received on the detection zone or a transimpedance amplifier which generates an output voltage proportional to the photocurrent flowing through the detection regions 4 and 9, or any other example.

To collect the minority carriers 21 generated by the impinging radiation, the gate structure 33 may comprise other than three gate electrodes on the insulating layer 25. Preferably, however, the number of gate electrodes should be chosen such that it provides a good trade-off between the smoothness of the potential function 24 and the complexity of the demodulation sensor 30. In an alternative embodiment of a demodulation sensor 30 according to the present invention, the gate structure 33 may comprise only a single electrode gate, located in between the two detection zones 4 and 9, wherein two are more contacts are provided on the gate to generate a non-uniform potential distribution $\phi$ at the semiconductor-insulator interface. The demodulating gate structures (4, 5, 6, 8, 9) can also be formed with conventional MOS transistors. If in such embodiments n+ regions are formed between the gates, this may lead to recombination and result in a reduction of the responsivity of the sensor.

It is an advantage of a modulation sensor 30 according to the present invention, that the demodulation zone 3 may be covered by a radiation shielding 17 so as to prevent electron-hole pairs being generated in or near the detection regions 4 and 9. The radiation shielding 17 may be fabricated from any suitable material, for example, it may be a metallic or an opaque layer. The use of a shielding provides a clear distinction between the region where electron-holes are generated, and the demodulation region 3. Hence, majority carriers generated in the substrate 31 due to the impinging radiation are hauled away from the detection regions 4 and 9 by means of the drift field $E_{drift}$, and are prevented to be generated in or near the detection regions 4 and 9 by means of the shielding layer 17. The shielding may be provided such that the whole demodulation region is shielded or may be provided such that regions 4 and 9 are shielded but that e.g. region 6 and a part of regions 5 and 8 remain unshielded, resulting in a slightly increased sensitivity.

In the example of FIG. 1, the demodulation sensor 30 comprises an array of gate structures 33, wherein the detection zones 4 and 9 are alternatingly arranged between the electrode gates (5,6,8). In one example of a demodulation process, two oscillating voltage signals Vmix1 and Vmix2=−Vmix1 with the same frequency as the modulation frequency f=1/T of a modulated radiation source may be applied to the gates 5 and 8, whereas the gates 6 are kept to a fixed voltage Vbias=0. Using this voltage configuration, the potential on gate 5 will be higher than the potential on gate 8 during half of the period T, and the generated minority charge carriers 21 will be collected in the detection regions 4. For the other half of the period T, the potential on gate 5 will be lower than the potential on gate 8, and the generated minority charge carriers 21 will be collected in the detection regions 9. When all detection regions 4 are arranged in a first read-out circuit, and the detection regions 9 in a second read-out circuit, the result after a certain exposure time are two output voltages that are indicative of the accumulated charges on the detection zones 4 and 9. From the difference and the summation of the output voltages, the phase difference $\Delta P$ between the modulated radiation source and the radiation 28 which impinges on the demodulation sensor 30 can be calculated. The above is given for illustrating one example of a possible post processing for time of flight measurements, embodiments of the present invention not being limited thereto. Techniques for demodulation of a sensed modulated radiation field are known to the person skilled in the art.

In a time of flight experiment, the phase difference $\Delta P$ can then be used to determine the distance to an object. A modulated radiation field is projected on a target, reflected by the target and detected by the demodulation sensor 30. The calculated phase delay $\Delta P$ which the signal experiences during transmission is directly related to the distance to the target via the formula $D=(\Delta P \cdot c \cdot T)/720$, with D=the distance, c=speed of light, T=modulation period and $\Delta P$=the phase difference between the emitted radiation field and the detected radiation field in degrees.

Figure 4:
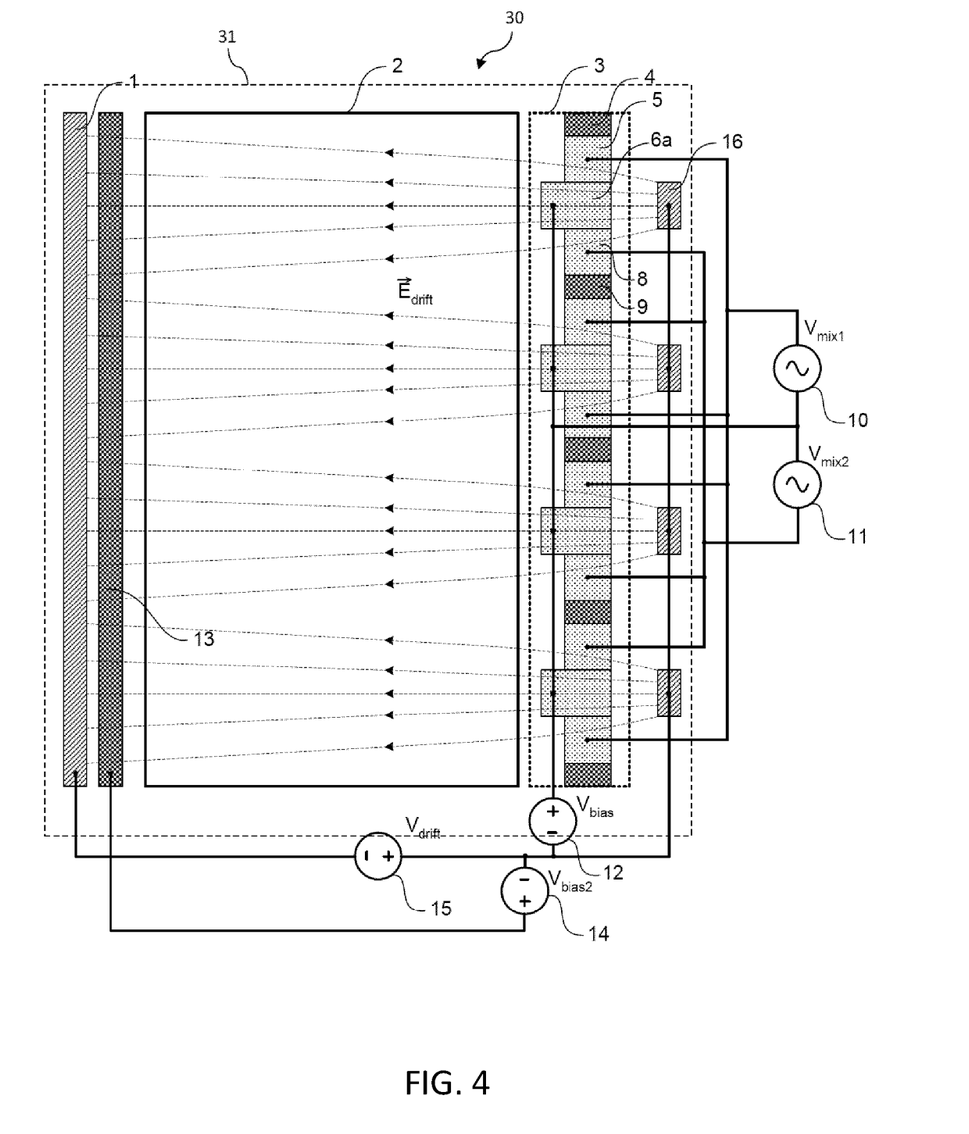
FIG. 4 is a top view of an alternative embodiment of the present invention, wherein substrate contacts are only provided behind the middle gate of the gate structures.
Figure 5:
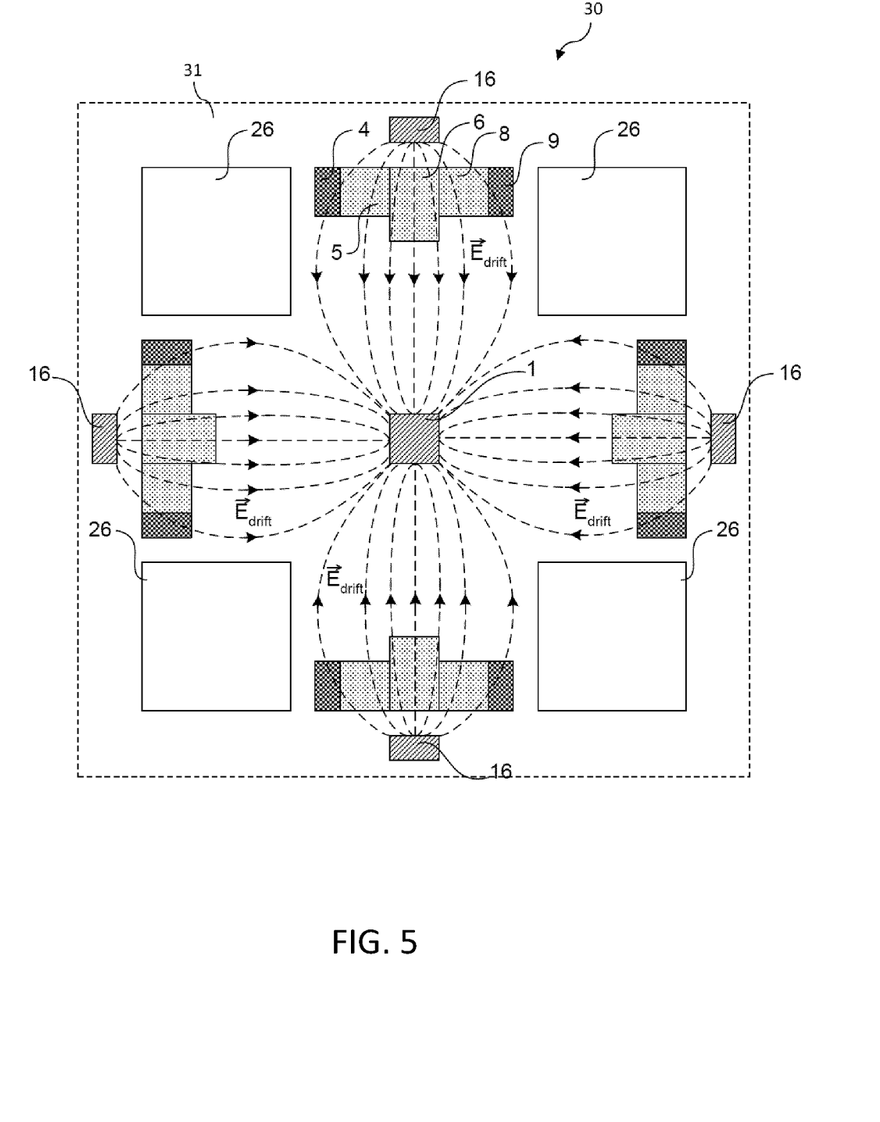
FIG. 5 is a top view of an alternative embodiment of the present invention, wherein each side of the substrate is provided with a gate structure.

FIG. 4 shows an alternative embodiment of a demodulation sensor 30 according to the present invention, where the ohmic contact 7 is replaced by single ohmic contacts 16 which are fabricated behind the middle gates 6 of the gate structures 33 In such configuration the number of photoelectrons attracted to the middle gate is increased which improves the demodulation contrast since all the carriers which arrive under middle gate obtain the correct velocity $v'_{drift}$. Making the middle gate larger can also increase the number of photoelectrons attracted to the middle gate. In yet another alternative embodiment, a cross-shaped configuration for a demodulation sensor 30 may be used, wherein each side of the square substrate 31 is provided with a gate structure 33. This is illustrated in FIG. 5. The p-region 1 is now fabricated in the centre of the substrate 31, with the electric field lines 32 running from the p-regions 16 towards the p-region region 1 or inverse, depending on the polarity of the applied voltage. Electromagnetic radiation impinging on the substrate 31 will create an electron-hole pair, from which the minority charge carrier 21 will drift towards one of the four gate structures 33, depending on the quadrant in which the electron-hole pair is created.

Figure 6:
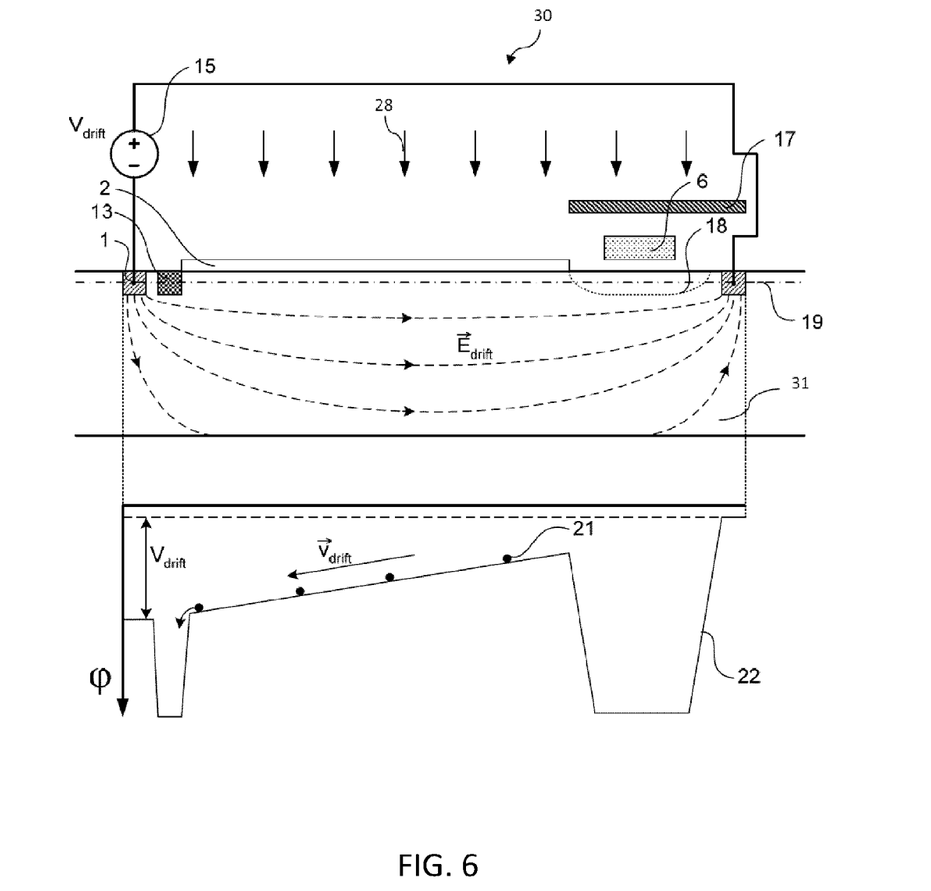
FIG. 6 shows a cross-sectional view of the modulation sensor of FIG. 1, illustrating the electrical field configuration of the sensor in shutter mode.

In this configuration it is possible, due to the static field, to drive each of the gate demodulation structures with different phase shifted control reference signals. This feature is very beneficial in TOF since all the information needed for distance calculation can be gathered during one integration period using a single pixel. This will reduce the movement artifacts, which is for example especially useful in the automotive applications. The latter can be seen as follows:

In operation the received light is modulated in intensity and phase, where the phase modulation is caused by the scene's 3D information. The signal's amplitude and phase can be retrieved by synchronously demodulating the incoming modulated light within the demodulation sensor. Demodulation of the received modulated signal can be performed by correlation with the original modulation signal, also known as cross correlating, and evaluation of the correlation function for different measurements. Using the embodiment shown in FIG. 5, different measurements and thus different correlation values can be collected simultaneously in the pixel configuration, so that moving artifacts can be reduced. In some embodiments of a pixel configuration as shown in FIG. 5, in the regions where no electric drift field $E_{drift}$ is present, light shieldings 26 may be provided to prevent the creation of electron-hole pairs. The readout circuits can be placed underneath the light shielding 26. It is an advantage of a demodulation sensor 33 according to the present invention, that the dynamic current consumption of the sensor 33 will be low, since the drift field $E_{drift}$ in the substrate 31 is maintained by a static current. Hence, the dynamical power consumption of the sensor 33 is only determined by the power consumption of the demodulation zone 3. The static power consumption in the drift region 2 can furthermore be lowered by decreasing the doping of the substrate material FIG. 6(*a*) shows is a cross-sectional view of a demodulation sensor 30 according to the present invention, wherein the demodulation sensor 30 is operated in shutter mode. Opposite to the example of FIG. 2, the potential of doped p-region 7 is now lower than the potential of doped p-region 1, so that the minority carriers 21 generated by the impinging radiation 28 drift towards the p-doped region 1. FIG. 6(b) shows the potential distribution 22 at a small depth 19 in the substrate 31. It is an advantage of the present demodulation sensor 30 that the responsivity of the device in the shutter mode can be reduced to nearly zero.

In one embodiment of the present invention, an n-doped region 13 may be provided in the substrate, such that the minority carriers 21 have a large chance to be trapped in the depletion zone of this region 13. If means for reading out the amount of charge are attached to region 13 (e.g. 3T active pixel circuit) the sensor in the shutter mode can be used a conventional (non-demodulating image sensor).

It is an advantage of embodiments according to the present invention that the at least one gate in the at least one gate structure, which typically may be placed near an ohmic contact with high or highest potential, induces a potential gradient underneath the gate structure, changing the trajectory of the photoelectron in the bulk of the substrate by drift. The photoelectrons thus are guided to one or another detection area (which also may be referred to as collection area) directly. In this way, the charges are arriving to the whole volume underneath the gate structure.

The present invention also relates to the use of a demodulation sensor as described in the first aspect for automotive applications.

In a second aspect, the present invention relates to a method for determining the modulation parameters of an incident modulated radiation field impinging on a substrate. The method may be particularly be used in automotive applications. It can be used in various applications wherein Time of Flight measurements can be applied. The method comprises generating a static majority current assisted drift field in the substrate. The method also comprises collecting and accumulating minority carriers in one of at least two regions using a lateral electric drift field under at least one gate structure and induced by at least one gate of the at least one gate structure, the minority carriers being generated in the substrate by the impinging radiation field, the minority carriers being directed towards the at least one region under influence of the static majority current assisted drift field and the lateral electric drift field induced by the gate structure. The method also comprises reading out the accumulated minority carriers in the regions and using the read-out of the at least one region for calculating the modulation parameters of the incident modulated radiation field. Further optional steps may express the functionality of one or more elements or part thereof of the device as described in the first aspect.

The invention claimed is:

1. A demodulation sensor for detecting and demodulating a modulated radiation field impinging on a substrate, the sensor comprising:
    means for generating, in the substrate, a static majority current assisted drift field;
    at least one gate structure for collecting and accumulating minority carriers, the minority carriers being generated in the substrate by the impinging radiation field, the at least one gate structure comprising at least two regions for the collection and accumulation of the minority carriers and at least one gate adapted for inducing a lateral electric drift field under the gate structure, the system thus being adapted for directing the minority carriers towards one of the at least two regions for the collection and accumulation of the minority carriers under influence of the static majority current assisted drift field and the lateral electric drift field induced by the gate structure, and
    means for reading out the accumulated minority carriers in that region,
    wherein the means for generating a static majority current assisted drift field comprises at least two ohmic contacts in the substrate to generate a majority current assisted drift field.

2. The demodulation sensor according to claim 1, wherein the means for generating a static majority current assisted drift field and the at least one gate structure are based on CMOS compatible components.

3. The demodulation sensor according to claim 1, wherein the means for generating a static majority current assisted drift field is positioned in a region outside a radiation receiving window of the sensor.

4. The demodulation sensor according to claim 1, wherein the means for generating a static majority current assisted drift field is positioned on the substrate in a region outside a radiation receiving window of the sensor.

5. The demodulation sensor according to claim 1, wherein the sensitive region of the substrate is covered by an anti-reflecting coating.

6. The demodulation sensor according to claim 1, wherein the magnitude of the majority current assisted drift field is adapted to obtain an optimal drift speed of the minority carriers in the substrate.

7. The demodulation sensor according to claim 1, wherein each gate structure comprises at least one gate positioned in between the at least two regions.

8. The demodulation sensor according to claim 1, wherein the at least one gate structure for collecting and accumulating minority carriers is a demodulating structure and is positioned in a region outside a radiation receiving window of the sensor.

9. The demodulation sensor according to claim 1, wherein the lateral drift field under the gate structure is generated by applying a control voltage to at least one gate electrode.

10. The demodulation sensor according to claim 1, wherein at least part of the gate structures is covered with a radiation shielding.

11. The demodulation sensor according to claim 1, wherein the demodulation sensor comprises four gate structures for collecting and accumulating minority carriers in corresponding regions, the four gate structures being positioned in a cross-shaped configuration.

12. The demodulation sensor according to claim 1, wherein the sensor comprises a controller programmed for controlling the means for generating, in the substrate, a static majority current assisted drift field so as to alternate the static majority current assisted drift field for inducing a shutter mode.

13. The demodulation sensor according to claim 1, wherein the shutter mode can be used as a conventional (non-demodulating) image sensor.

14. A method for determining the modulation parameters of an incident modulated radiation field impinging on a substrate, the method comprising:
    generating a static majority current assisted drift field in the substrate by a generating means comprising at least two ohmic contacts in the substrate;
    collecting and accumulating minority carriers in one of at least two regions using a lateral electric drift field under at least one gate structure and induced by at least one gate of the at least one gate structure, the minority carriers being generated in the substrate by the impinging radiation field, the minority carriers being directed towards the at least one region under influence of the static majority current assisted drift field and the lateral electric drift field induced by the at least one gate;

reading out the accumulated minority carriers in the at least one region; and using the read-out of the at least one region for calculating the modulation parameters of the incident modulated radiation field.

* * * * *